United States Patent
Kraus et al.

(10) Patent No.: US 11,114,282 B2
(45) Date of Patent: Sep. 7, 2021

(54) PHASED ARRAY MODULAR HIGH-FREQUENCY SOURCE

(71) Applicant: Applied Materials, Inc., Santa Clara, CA (US)

(72) Inventors: Philip Allan Kraus, San Jose, CA (US); Thai Cheng Chua, Cupertino, CA (US); Christian Amormino, San Jose, CA (US); Dmitry A. Dzilno, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/895,904

(22) Filed: Jun. 8, 2020

(65) Prior Publication Data

US 2020/0303167 A1 Sep. 24, 2020

Related U.S. Application Data

(63) Continuation of application No. 16/669,257, filed on Oct. 30, 2019, now Pat. No. 10,720,311, which is a
(Continued)

(51) Int. Cl.
*H01J 37/32* (2006.01)
*H01Q 3/34* (2006.01)
(Continued)

(52) U.S. Cl.
CPC .. *H01J 37/32201* (2013.01); *H01J 37/32229* (2013.01); *H01Q 3/34* (2013.01); *H01Q 21/0025* (2013.01); *H03B 5/24* (2013.01)

(58) Field of Classification Search
CPC .......... H01J 37/32201; H01J 37/32229; H01Q 3/34; H01Q 21/0025; H03B 5/24
See application file for complete search history.

(56) References Cited

U.S. PATENT DOCUMENTS

| 5,053,678 A | 10/1991 | Koike et al. |
| 5,081,398 A | 1/1992 | Asmussen et al. |

(Continued)

FOREIGN PATENT DOCUMENTS

| WO | WO 2013114870 | 8/2013 |
| WO | WO 2013122043 | 8/2013 |

(Continued)

OTHER PUBLICATIONS

International Search Report and Written Opinion from PCT/US2017/013984 dated May 1, 2017, 10 pgs.
(Continued)

*Primary Examiner* — Anne M Hines
(74) *Attorney, Agent, or Firm* — Schwabe, Williamson & Wyatt, P.C.

(57) ABSTRACT

Embodiments described herein include a modular high-frequency emission source comprising a plurality of high-frequency emission modules and a phase controller. In an embodiment, each high-frequency emission module comprises an oscillator module, an amplification module, and an applicator. In an embodiment, each oscillator module comprises a voltage control circuit and a voltage controlled oscillator. In an embodiment, each amplification module is coupled to an oscillator module, in an embodiment, each applicator is coupled to an amplification module. In an embodiment, the phase controller is communicatively coupled to each oscillator module.

20 Claims, 11 Drawing Sheets

Related U.S. Application Data continuation of application No. 15/958,569, filed on Apr. 20, 2018, now Pat. No. 10,504,699.

(51) Int. Cl.
*H01Q 21/00* (2006.01)
*H03B 5/24* (2006.01)

(56) References Cited

U.S. PATENT DOCUMENTS

| | | | |
|---|---|---|---|
| 5,134,965 | A | 8/1992 | Tokuda et al. |
| 5,179,264 | A | 1/1993 | Cuomo et al. |
| 5,180,436 | A | 1/1993 | Ueda et al. |
| 5,304,277 | A | 4/1994 | Ohara et al. |
| 5,324,553 | A | 6/1994 | Ovshinsky et al. |
| 5,961,871 | A | 10/1999 | Bible et al. |
| 6,109,208 | A | 8/2000 | Tsuchihashi et al. |
| 6,158,383 | A | 12/2000 | Watanabe et al. |
| 6,204,603 | B1 | 3/2001 | Spitzl et al. |
| 6,263,830 | B1 | 7/2001 | Kamarehi et al. |
| 6,358,361 | B1 | 3/2002 | Matsumoto |
| 6,741,944 | B1 | 5/2004 | Verdeyen et al. |
| 8,308,898 | B2 | 11/2012 | Kasai et al. |
| 9,245,741 | B2 | 1/2016 | Karakawa |
| 9,281,154 | B2 | 3/2016 | Ikeda et al. |
| 9,478,410 | B2 | 10/2016 | Kamada et al. |
| 2003/0178143 | A1 | 9/2003 | Perrin |
| 2004/0007983 | A1 | 1/2004 | Sirkis et al. |
| 2004/0011465 | A1 | 1/2004 | Matsumoto et al. |
| 2005/0173069 | A1 | 8/2005 | Tolmachev et al. |
| 2006/0081624 | A1 | 4/2006 | Takada et al. |
| 2006/0137613 | A1 | 6/2006 | Kasai |
| 2010/0074807 | A1 | 3/2010 | Bulkin et al. |
| 2011/0061814 | A1 | 3/2011 | Ikeda |
| 2011/0174778 | A1 | 7/2011 | Sawada et al. |
| 2011/0195201 | A1 | 8/2011 | Zhu et al. |
| 2011/0215722 | A1 | 9/2011 | Pelletier et al. |
| 2012/0247676 | A1 | 10/2012 | Fujino et al. |
| 2013/0284370 | A1 | 10/2013 | Collins et al. |
| 2014/0002196 | A1 | 1/2014 | Leek |
| 2014/0197761 | A1 | 7/2014 | Grandemenge et al. |
| 2014/0283780 | A1 | 9/2014 | Smith et al. |
| 2015/0007774 | A1 | 1/2015 | Iwasaki et al. |
| 2015/0144265 | A1 | 5/2015 | Fujino et al. |
| 2015/0206778 | A1 | 7/2015 | Shimomura |
| 2015/0211124 | A1 | 7/2015 | Nozawa et al. |
| 2015/0232993 | A1 | 8/2015 | Iwao et al. |
| 2015/0279627 | A1 | 10/2015 | Iwasaki et al. |
| 2015/0371828 | A1 | 12/2015 | Stowell |
| 2016/0189950 | A1 | 6/2016 | Oyama et al. |
| 2016/0322218 | A1 | 11/2016 | Fukiage et al. |
| 2016/0358757 | A1* | 12/2016 | Ikeda ............... H01J 37/32201 |
| 2017/0032939 | A1 | 2/2017 | Choquet et al. |
| 2017/0133202 | A1 | 5/2017 | Berry, III |
| 2017/0170010 | A1* | 6/2017 | Miyahara .......... H01J 37/32715 |
| 2017/0309452 | A1* | 10/2017 | Fujino ............... H01J 37/32247 |
| 2018/0127880 | A1 | 5/2018 | Kotani et al. |
| 2018/0218883 | A1 | 8/2018 | Iwao |
| 2018/0277339 | A1 | 9/2018 | Kaneko et al. |

FOREIGN PATENT DOCUMENTS

| | | |
|---|---|---|
| WO | WO 2014017132 | 1/2014 |
| WO | WO 2016089424 | 6/2016 |

OTHER PUBLICATIONS

International Search Report and Written Opinion from PCT/US2018/022044 dated Jun. 29, 2018, 11 pgs.
International Search Report and Written Opinion from PCT/US2018/026330 dated Jul. 26 2018, 12 pgs.
Non-Final Office Action from U.S. Appl. No. 15/238,695 dated Jan. 25, 2019, 30 pgs.
International Preliminary Report on Patentability from PCT/US2017/013984 dated Feb. 19, 2019, 15 pgs.
Non-Final Office Action from U.S. Appl. No. 15/958,569 dated Apr. 17, 2019, 10 pgs.
Non-Final Office Action from U.S. Appl. No. 15/485,217 dated May 15, 2019, 23 pgs.
Non-Final Office Action from U.S. Appl. No. 15/238,695 dated Jul. 5, 2019, 25 pgs.
Non-Final Office Action from U.S. Appl. No. 15/588,597 dated Oct. 15, 2019, 20 pgs.
International Preliminary Report on Patentability from PCT/US2018/022044 dated Oct. 24, 2019, 8 pgs.

* cited by examiner

PHASED ARRAY MODULAR HIGH-FREQUENCY SOURCE

CROSS-REFERENCE TO RELATED APPLICATIONS

This application is a continuation of U.S. patent application No. Ser. 16/669,257, filed on Oct. 30, 2019, which is a continuation of U.S. patent application Ser. No. 15/958,569, filed on Apr. 20, 2018, now U.S. patent Ser. No. 10/504,699, issued on Dec. 10, 2019, the entire contents of which are hereby incorporated by reference herein.

BACKGROUND

1) Field

Embodiments relate to the field of high-frequency emission sources and, in a particular embodiment, to a modular high-frequency emission source that includes an array of high-frequency emission modules with each high-frequency emission module comprising an oscillator module coupled to an amplification module and an applicator.

2) Description of Related Art

Use of high-frequency radiation systems, including for use in plasma processing, are used extensively in the manufacture of many different technologies, such as those in the semiconductor industry, display technologies, microelectromechanical systems (MEMS), and the like. Currently, radio frequency (RF) radiation systems with a single antenna are most often used. However, in the case of plasmas generated with high frequencies, including microwave frequencies, a plasma with higher plasma density and/or a plasma with a high concentration of excited neutral species are formed. Unfortunately, high-frequency radiation systems which are generated from a single antenna, for example those used to form plasmas, suffer their own drawbacks.

Typical high-frequency radiation systems, for example those to form a microwave plasma, use a singular, large source of high-frequency or microwave radiation (e.g., a magnetron) and a transmission path for guiding the microwave radiation from the magnetron to the processing chamber. For example, in typical high power microwave applications in the semiconductor industry the transmission path is a microwave waveguide. Waveguides are used because outside of a waveguide designed to carry the specific frequency of the microwave source, the microwave power attenuates rapidly with distance. Additional components, such as tuners, couplers, mode transformers, and the like are also required to transmit the microwave radiation to the processing chamber. These components limit the construction to large systems (i.e., at least as large as the sum of the waveguide and associated components), and severely limit the design. As such, the geometry of the high-frequency radiation field, which may be used to form a plasma, is constrained since the geometry of the high-frequency radiation field resembles the shape of waveguides.

Accordingly, it is difficult to match the geometry of a high-frequency radiation field to the geometry of the substrate that is being processed. In particular, it is difficult to create a high-frequency radiation field at microwave frequencies, either to form a plasma or to expose a substrate to radiation, where the process is uniformly performed on the whole area of the substrate (e.g., 200 mm, 300 mm or larger diameter silicon wafers, glass substrates used in the display industry, or continuous substrates used in roll-to-roll manufacturing, or the like). Some microwave generated plasmas may use a slot line antenna to allow the microwave energy to be spread over an extended surface. However, such systems are complicated, require specific geometry, and are limited in the power density that can be coupled to the plasma.

Furthermore, high-frequency radiation systems typically generate radiation fields and/or plasmas that are not highly uniform and/or are not able to have a spatially tunable density. As the substrates that are being processed continue to increase in size, it becomes increasingly difficult to account for edge effects. Additionally, the inability to tune the radiation field and/or plasma limits the ability to modify processing recipes to account for incoming substrate non-uniformity and adjust the radiation field density and/or the plasma density for processing systems in which a nonuniformity is required to compensate for the design of the processing system (e.g., to accommodate the nonuniform radial velocity of the rotating wafers in some processing chambers).

SUMMARY

Embodiments described herein include a modular high-frequency emission source comprising a plurality of high-frequency emission modules and a phase controller. In an embodiment, each high-frequency emission module comprises an oscillator module, an amplification module, and an applicator. In an embodiment, each oscillator module comprises a voltage control circuit and a voltage controlled oscillator. In an embodiment, each amplification module is coupled to an oscillator module. In an embodiment, each applicator is coupled to an amplification module. In an embodiment, the phase controller is communicatively coupled to each oscillator module.

Embodiments described herein include a modular high-frequency emission source. In an embodiment, the modular high-frequency emission source comprises a plurality of high-frequency emission modules and a phase controller. In an embodiment, each high-frequency emission module comprises, an oscillator module, an amplification module, and an applicator. In an embodiment the oscillator module comprises a voltage control circuit and a voltage controlled oscillator, where an output voltage from the voltage control circuit drives oscillation in the voltage controlled oscillator to generate an output high-frequency electromagnetic radiation. In an embodiment, the amplification module is coupled to the oscillator module, and the amplification module amplifies the output high-frequency electromagnetic radiation from the voltage controlled oscillator. In an embodiment, the applicator is coupled to the amplification module. In an embodiment, the phase controller is communicatively coupled to each of the oscillator modules. In an embodiment, the phase controller controls a phase relationship of the output high-frequency electromagnetic radiation generated by each of the oscillator modules.

Embodiments described herein include a processing tool that comprises a processing chamber and a modular high-frequency emission source. In an embodiment the modular high-frequency emission source comprises a plurality of high-frequency emission modules and a phase controller. In an embodiment, each high-frequency emission module comprises an oscillator module, an amplification module, and an applicator. In an embodiment, each oscillator module comprises a voltage control circuit and a voltage controlled oscillator. In an embodiment, each amplification module is coupled to an oscillator module In an embodiment, each applicator is coupled to an amplification module. In an embodiment, the applicator is positioned opposing a chuck in the processing chamber on which one or more substrates are processed. In an embodiment, the phase controller is communicatively coupled to each oscillator module.

The above summary does not include an exhaustive list of all embodiments. It is contemplated that all systems and methods are included that can be practiced from all suitable combinations of the various embodiments summarized above, as well as those disclosed in the Detailed Description below and particularly pointed out in the claims filed with the application. Such combinations have particular advantages not specifically recited in the above summary.

DETAILED DESCRIPTION

Figure 1:
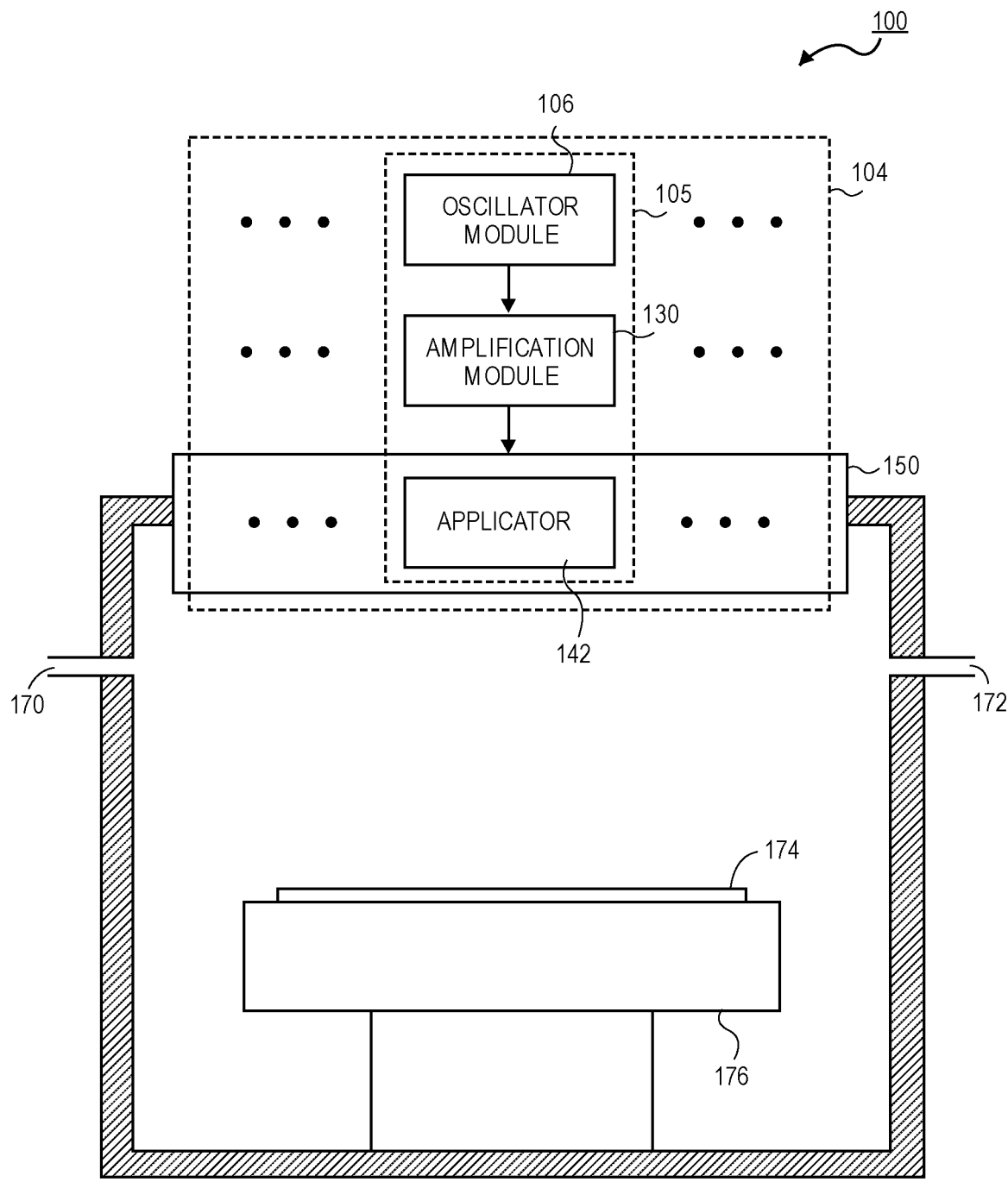
FIG. 1 is a schematic diagram of a processing tool that includes a modular high-frequency emission source, in accordance with an embodiment.

Devices in accordance with embodiments described herein include a modular high-frequency emission source that comprises an array of high-frequency emission modules that are configured to function as a phased array. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Embodiments include a modular high-frequency emission source that comprises an array of high-frequency emission modules. As used herein, "high-frequency" electromagnetic radiation includes radio frequency radiation, very-high-frequency radiation, ultra-high-frequency radiation, and microwave radiation. "High-frequency" may refer to frequencies between 0.1 MHz and 300 GHz. According to an embodiment, each high-frequency emission module comprises an oscillator module, an amplification module, and an applicator. In an embodiment, the oscillator module and the amplification module comprise electrical components that are all solid state electronic components.

In an embodiment, the phase controller, the oscillator modules, and the amplification modules comprise electrical components that are all solid state electronic components. The use of solid state electronics instead of, for example a magnetron, allows for a significant reduction in the size and the complexity of the a high-frequency radiation source. Particularly, the solid state components are much smaller than the magnetron hardware described above. Additionally, the use of solid state components allows for the elimination of bulky waveguides needed to transmit the high-frequency radiation to the processing chamber. Instead, the high-frequency radiation may be transmitted with coaxial cabling. The elimination of waveguides also allows for the construction of a large area modular high-frequency emission source where the size of the plasma formed is not limited by the size of waveguides. Instead, an array of high-frequency emission modules may be constructed in a given pattern that allows for the formation of a plasma that is arbitrarily large (and arbitrarily shaped) to match the shape of any substrate. Furthermore, the cross-sectional shape of the applicators may be chosen so that the array of applicators may be packed together as tightly as possible (i.e., a closed-packed array).

The use of an array of high-frequency emission modules also provides greater flexibility in the ability to locally change the radiation field and/or the plasma density by independently changing the power settings of the amplification module for each high-frequency emission module. This allows for uniformity optimization during radiation field exposure and/or plasma processing, such as adjustments made for wafer edge effects, adjustments made for incoming wafer nonuniformity, and the ability to adjust the radiation field exposure and/or plasma density for processing systems in which a nonuniformity is needed to compensate for the design of the processing system (e.g., to accommodate the nonuniform radial velocity of the rotating wafers in some processing chambers).

Additional embodiments may also include one or more radiation field exposure and/or plasma monitoring sensors. Such embodiments provide a way to measure the density of the plasma, or the electric field strength, or any other plasma property or radiation field property, locally by each applicator, and to use that measurement as part of a feedback loop to control the power applied to each high-frequency emission module. Accordingly, each high-frequency emission module may have independent feedback, or a subset of the high-frequency emission modules in the array may be grouped in zones of control where the feedback loop controls the subset of high-frequency emission modules in the zone.

In addition to the enhanced tuneability of the radiation field and/or the plasma, the use of individual high-frequency emission modules provides a greater power density than are currently available in existing radiation sources and/or plasma sources. For example, high-frequency emission modules may allow for a power density that is approximately five or more times greater than typical RF plasma processing systems. For example, typical power into a plasma enhanced chemical vapor deposition process is approximately 3,000 W, and provides a power density of approximately 4 W/cm² for a 300 mm diameter wafer. In contrast, high-frequency emission modules according to embodiments may use a 300 W power amplifier with a 4 cm diameter applicator, to provide a power density of approximately 24 W/cm² at an applicator packing density of approximately 1. At an applicator packing density of 1/3 and with use of a 1000 W power amplifier, a power density of 27 W/cm² is provided. At an applicator packing density of 1 and with use of a 1000 W power amplifier, a power density of 80 W/cm² is provided.

Usual approaches for making high-frequency radiation sources and/or plasmas (e.g., microwave plasmas) involve the use of a single oscillator module and a single electrode or applicator to couple the high-frequency energy to the substrate and/or, in the case of forming a plasma, to the process gas. However, using multiple electrode/applicator structures with a single oscillator module that is split to power each of the multiple electrodes/applicators has drawbacks. Particularly, an interference pattern will necessarily form because the electromagnetic radiation generated by a single oscillator module results in electromagnetic radiation emitted by each applicator to be at the same frequency and at a fixed phase with each other. The interference pattern produces local maxima and minima that result in a non-uniform radiation field and/or plasma.

Accordingly, embodiments include an array of high-frequency emission modules with each high-frequency emission module having its own oscillator module. In order to provide control of the interference patterns generated by each oscillator module, the oscillator modules may be communicatively coupled to a phase controller. In an embodiment, the phase controller may randomize the phase of electromagnetic radiation generated by each oscillator module in order to provide a uniform radiation field and/or plasma. For example, electromagnetic radiation generated by a first oscillator module may not interfere with the electromagnetic radiation generated by a second oscillator module because the first and second oscillator modules may not be at the same frequency nor have a controlled phase difference between the first and second oscillator modules. In embodiments where a plasma is formed, the plasma will have improved uniformity since there is no interference pattern. Similarly, when a plasma is not formed (e.g., microwave heating or microwave curing), interference patterns are avoided and, in an embodiment more uniform heating or curing of the substrate is obtained.

In an additional embodiment, the phase controller may be used to provide controlled interference of the electromagnetic radiation generated by each of the oscillator modules. The frequency controller may allow for the plurality of high-frequency emission modules to be operated as a phased array. For example, the phase controller may control the phase and the frequency of the high-frequency electromagnetic radiation generated by each of the oscillator modules in order to provide further control of the shape of the radiation field and/or plasma by providing constructive and destructive interference at desired locations in a chamber. In an embodiment, phase control of the oscillator modules may also allow for a radiation field and/or plasma that may be dynamic (e.g., scanned, moved, modulated, etc.) within a chamber.

Referring now to FIG. 1, a cross-sectional illustration of a processing tool 100 is shown, according to an embodiment. In some embodiments, the processing tool 100 may be a processing tool suitable for any type of processing operation that uses a radiation field and/or a plasma. For example, the processing tool 100 may be a processing tool used for plasma enhanced chemical vapor deposition (PECVD), plasma enhanced atomic layer deposition (PEALD), etch and selective removal processes, and plasma cleaning. While the embodiments described in detail herein are directed to plasma processing tools, it is to be appreciated that additional embodiments may include a processing tool 100 that includes any tool that utilizes high-frequency electromagnetic radiation. For example, a processing tool 100 that utilizes high-frequency electromagnetic radiation without forming a plasma may include industrial heating, degassing, surface activation, and/or curing processing tools 100.

Generally, embodiments include a processing tool 100 that includes a chamber 178. In processing tools 100, the chamber 178 may be a vacuum chamber. A vacuum chamber may include a pump (not shown) for removing gases from the chamber to provide the desired vacuum. Additional embodiments may include a chamber 178 that includes one or more gas lines 170 for providing processing gasses into the chamber 178 and exhaust lines 172 for removing byproducts from the chamber 178. In an additional embodiment, chamber 178 may be a pressure vessel, providing for maintaining a pressure equal to or greater than one atmosphere of pressure. While not shown, it is to be appreciated that the processing tool 100 may include a showerhead for evenly distributing the processing gases over a substrate 174. In some embodiments, the processing tool 100 may optionally not include a chamber, (i.e., the processing tool 100 may be a chamberless processing tool).

In an embodiment, the substrate 174 may be supported on a chuck 176. For example, the chuck 176 may be any suitable chuck, such as an electrostatic chuck. The chuck may also include cooling lines and/or a heater to provide temperature control to the substrate 174 during processing. Due to the modular configuration of the high-frequency emission modules described herein, embodiments allow for the processing tool 100 to accommodate any sized substrate 174. For example, the substrate 174 may be a semiconductor wafer (e.g., 200 mm, 300 mm, 450 mm, or larger). Alternative embodiments also include substrates 174 other than semiconductor wafers. For example, embodiments may include a processing tool 100 configured for processing glass substrates, (e.g., for display technologies).

According to an embodiment, the processing tool 100 includes a modular high-frequency emission source 104. The modular high-frequency emission source 104 may comprise an array of high-frequency emission modules 105. In an embodiment, each high-frequency emission module 105 may include an oscillator module 106, an amplification module 130, and an applicator 142. In an embodiment, the oscillator module 106 and the amplification module 130 may comprise electrical components that are solid state electrical components. In an embodiment, each of the plurality of oscillator modules 106 may be communicatively coupled to different amplification modules 130. In some embodiments, there may be a 1:1 ratio between oscillator modules 106 and amplification modules 130. For example, each oscillator module 106 may be electrically coupled to a single amplification module 130.

In an embodiment, each oscillator module 106 generates electromagnetic radiation that is transmitted to the amplification module 130. After processing by the amplification module 130, the electromagnetic radiation is transmitted to the applicator 142. According to an embodiment, an array 140 of applicators 142 are coupled to the chamber 178 and each emit the electromagnetic radiation into the chamber 178. In some embodiments, the applicators 142 couple the electromagnetic radiation to the processing gasses in the chamber 178 to produce a plasma.

Figure 2A:
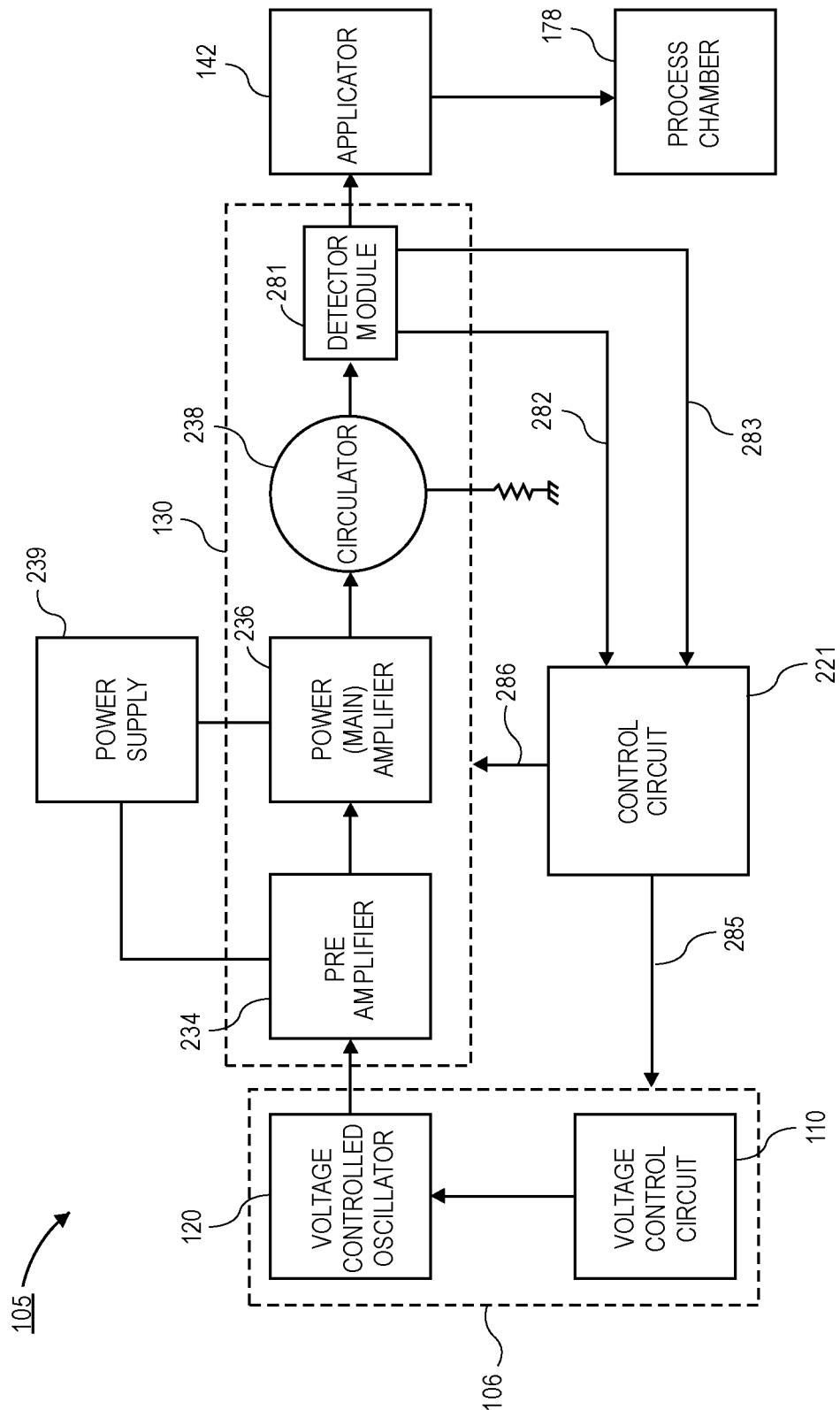
FIG. 2A is a schematic block diagram of a solid state high-frequency emission module with feedback control, in accordance with an embodiment.

Referring now to FIG. 2A, a schematic block diagram of the electronics in a high-frequency emission module 105 in the modular high-frequency emission source 104 is shown, according to an embodiment. In an embodiment, each oscillator module 106 includes a voltage control circuit 210 for providing an input voltage to a voltage controlled oscillator 220 in order to produce high-frequency electromagnetic radiation at a desired frequency. Embodiments may include an input voltage between approximately 1V and 10V DC. The voltage controlled oscillator 220 is an electronic oscillator whose oscillation frequency is controlled by the input voltage. According to an embodiment, the input voltage from the voltage control circuit 210 results in the voltage controlled oscillator 220 oscillating at a desired frequency. In an embodiment, the high-frequency electromagnetic radiation may have a frequency between approximately 0.1 MHz and 30 MHz. In an embodiment, the high-frequency electromagnetic radiation may have a frequency between approximately 30 MHz and 300 MHz. In an embodiment, the high-frequency electromagnetic radiation may have a frequency between approximately 300 MHz and 1 GHz. In an embodiment, the high-frequency electromagnetic radiation may have a frequency between approximately 1 GHz and 300 GHz. In an embodiment, the one or more of the plurality of oscillator modules 106 may emit electromagnetic radiation at different frequencies.

According to an embodiment, the electromagnetic radiation is transmitted from the voltage controlled oscillator 120 to the amplification module 130. The amplification module 130 may include a driver/pre-amplifier 234, and a main power amplifier 236 that are each coupled to a power supply 239. According to an embodiment, the amplification module 130 may operate in a pulse mode. For example, the amplification module 130 may have a duty cycle between 1% and 99%. In a more particular embodiment, the amplification module 130 may have a duty cycle between approximately 15% and 50%.

In an embodiment, the electromagnetic radiation may be transmitted to the applicator 142 after being processed by the amplification module 130. However, part of the power transmitted to the applicator 142 may be reflected back due to the mismatch in the output impedance. Accordingly, some embodiments include a detector module 281 that allows for the level of forward power 283 and reflected power 282 to be sensed and fed back to the control circuit module 221. It is to be appreciated that the detector module 281 may be located at one or more different locations in the system. In an embodiment, the control circuit module 221 interprets the reflected power 282 and the forward power 283, and determines the level for the control signal 285 that is communicatively coupled to the oscillator module 106, and level for the control signal 286 that is communicatively coupled to the amplifier module 130. In an embodiment, control signal 285 adjusts the oscillator module 106 to optimize the high-frequency of the radiation coupled to the amplification module 130. In an embodiment, control signal 286 adjusts the amplifier module 130 to optimize the output power coupled to applicator 142.

In an embodiment, the feedback control of the oscillator module 106 and the amplification module 130 may allow for the level of the reflected power to be less than approximately 5% of the forward power. In some embodiments, the feedback control of the oscillator module 106 and the amplification module 130 may allow for the level of the reflected power to be less than approximately 2% of the forward power. Accordingly, embodiments allow for an increased percentage of the forward power to be coupled into the processing chamber 178, and increases the available power coupled to the plasma. Furthermore, impedance tuning using a feedback control is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 220.

Figure 2B:
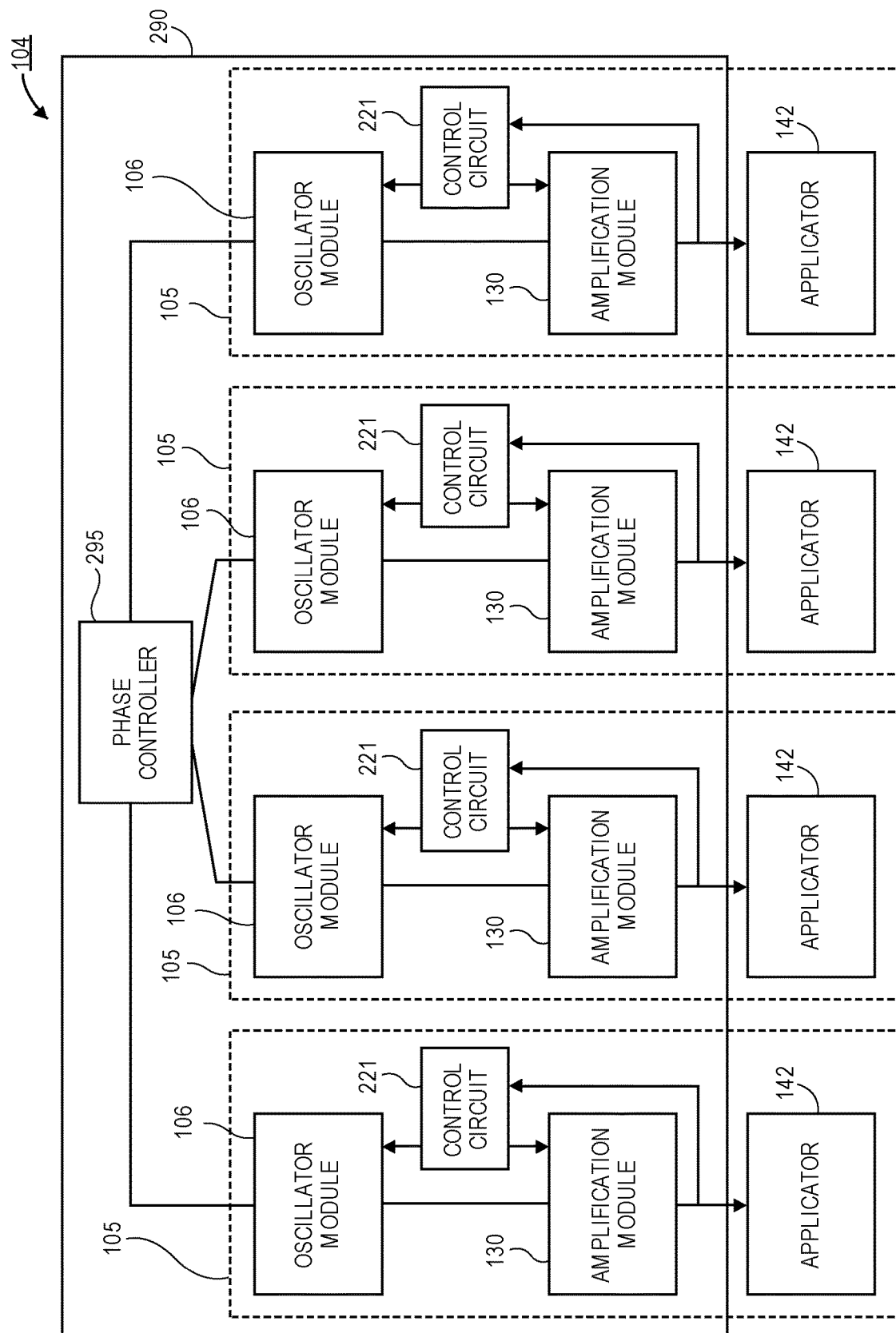
FIG. 2B is a schematic block diagram of a portion of the electronics of a processing tool with a modular high-frequency emission source that includes oscillator modules that are electrically coupled to a phase controller and feedback control, in accordance with an embodiment.

Referring now to FIG. 2B, a schematic of a portion of the solid state electronics of a modular high-frequency emission source 104 with an array of high-frequency emission modules 105 is shown, in accordance with an embodiment. In the illustrated embodiment, each high-frequency emission module 105 includes an oscillator module 106 that is communicatively coupled to a different amplification module 130. Each of the amplification modules 130 may be coupled to different applicators 142. In an embodiment, a control circuit 221 may be communicatively coupled to the oscillator module 106 and the amplification module 130.

In an embodiment, each of the plurality of oscillator modules 106 are communicatively coupled to a phase controller 295. In an embodiment, the phase controller 295 may be used to control a phase relationship and frequency of electromagnetic radiation generated by each of the oscillator modules 106. For example, the phase controller 295 may include a processor that generates a signal that is transmitted to each oscillator module 106. The signal may initiate the oscillator modules 106 at different times in order to generate different phases.

In such an embodiment, the phase controller 295 allows for the applicators 142 of each high-frequency emission modules 105 to be operated as part of a phased array. A phased array allows for the electromagnetic radiation emitted by each of the applicators 142 to add together (i.e., constructive interference) to increase the radiation in a desired location of the chamber, while cancelling (i.e., destructive interference) to suppress radiation in undesired locations of the chamber 178. The spatial relationship of the applicators 142 and the frequency of the electromagnetic radiation generated by the oscillator modules 106 may be inputs used by the phase controller 295 to determine the phase relationship of the electromagnetic radiation needed to form a desired electromagnetic radiation pattern in the processing chamber 178.

In an embodiment, the phase controller 295 may be operated to provide a static electromagnetic radiation pattern in the chamber 178. For example, a static electromagnetic radiation pattern may refer to a relatively unchanging pattern of constructive and destructive interference in the chamber 178. In an embodiment, the phase controller 295 may be operated to provide a dynamic electromagnetic radiation pattern in the chamber 178. For example, a dynamic electromagnetic radiation pattern may refer to a pattern where the local maxima and/or minima are moved throughout the volume of the chamber 178. Such an embodiment may be beneficial when used in processing tools that include substrates that are moved through different processing zones.

In the illustrated embodiment, each of the oscillator modules 106 and the amplification modules 130 are formed on a single board 290, such as a printed circuit board (PCB). However, it is to be appreciated that the oscillator modules 106 and the amplification module 130 may be formed on two or more different boards 290. In the illustrated embodiment four high-frequency emission modules 105 are shown. However, it is to be appreciated that the modular high-frequency emission source 104 may include two or more high-frequency emission modules 105. For example the modular high-frequency emission source 104 may include 2 or more high-frequency emission modules, 5 or more high-frequency emission modules, 10 or more high-frequency emission modules, or 25 or more high-frequency emission modules.

In accordance with an additional embodiment, a single oscillator module 106 may be used to form a phased array. In such an embodiment, the high-frequency electromagnetic radiation from the single oscillator 106 may be split and transmitted to each high-frequency emission module 105. The each high-frequency emission module 105 may include a phase shifter or other signal modifier that may modify the high-frequency electromagnetic radiation from the single oscillator 106. Accordingly, the high-frequency electromagnetic radiation generated by each high-frequency emission module 105 may be the same, and the high-frequency electromagnetic radiation generated by the high frequency emission modules 105 may have a controlled phase relationship.

Figure 2C:
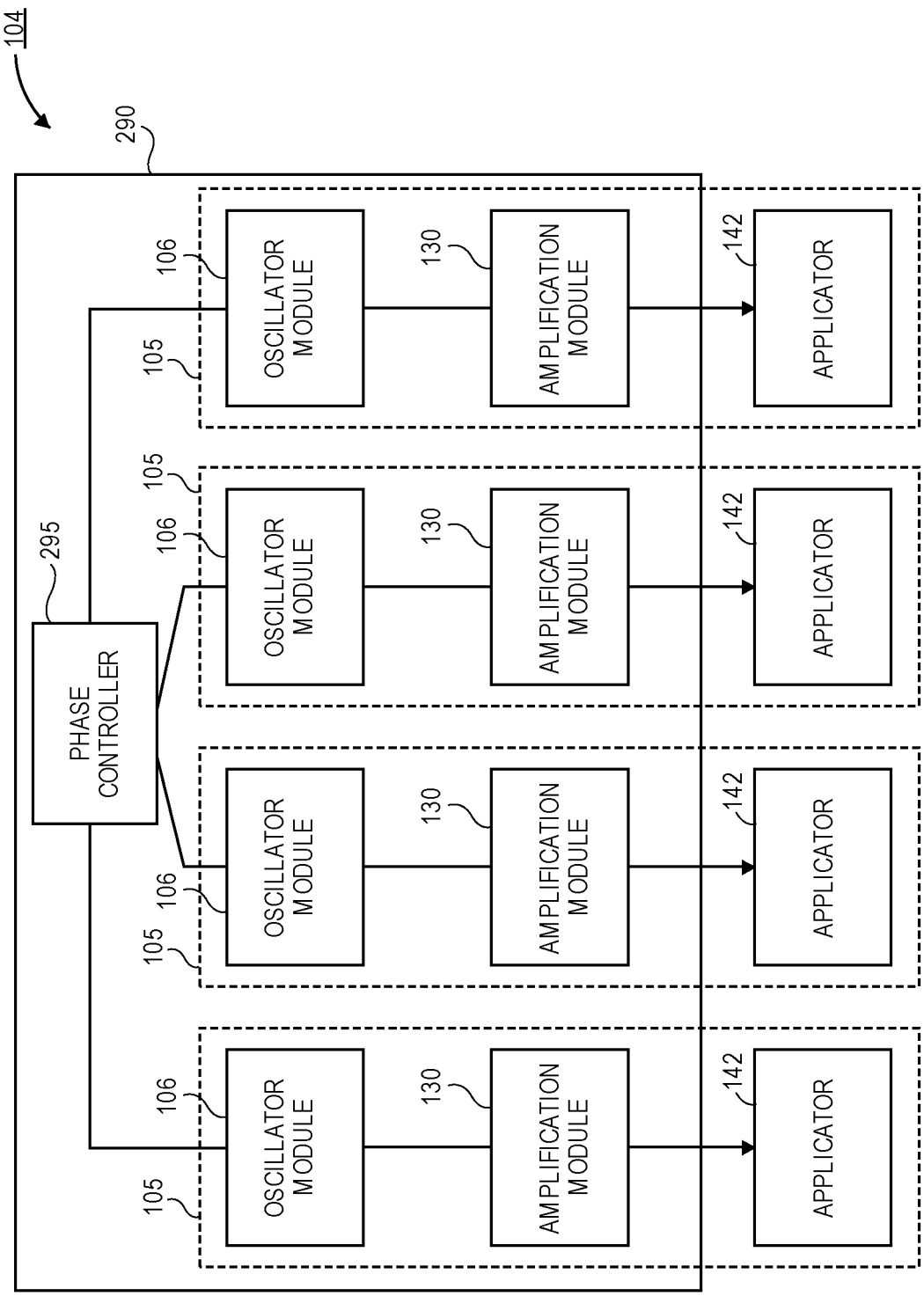
FIG. 2C is a schematic block diagram of a portion of the electronics of a processing tool with a modular high-frequency emission source that includes oscillator modules that are electrically coupled to a phase controller, in accordance with an embodiment.

Referring now to FIG. 2C, a schematic of a portion of the solid state electronics of a modular high-frequency emission source 104 with an array of high-frequency emission modules 105 is shown, in accordance with an embodiment. FIG. 2C is substantially similar to the system illustrated in FIG. 2B, with the exception that the control circuit is omitted. Particularly, in some embodiments the feedback control provided by a detector and the control circuit may not be needed.

Figure 3:
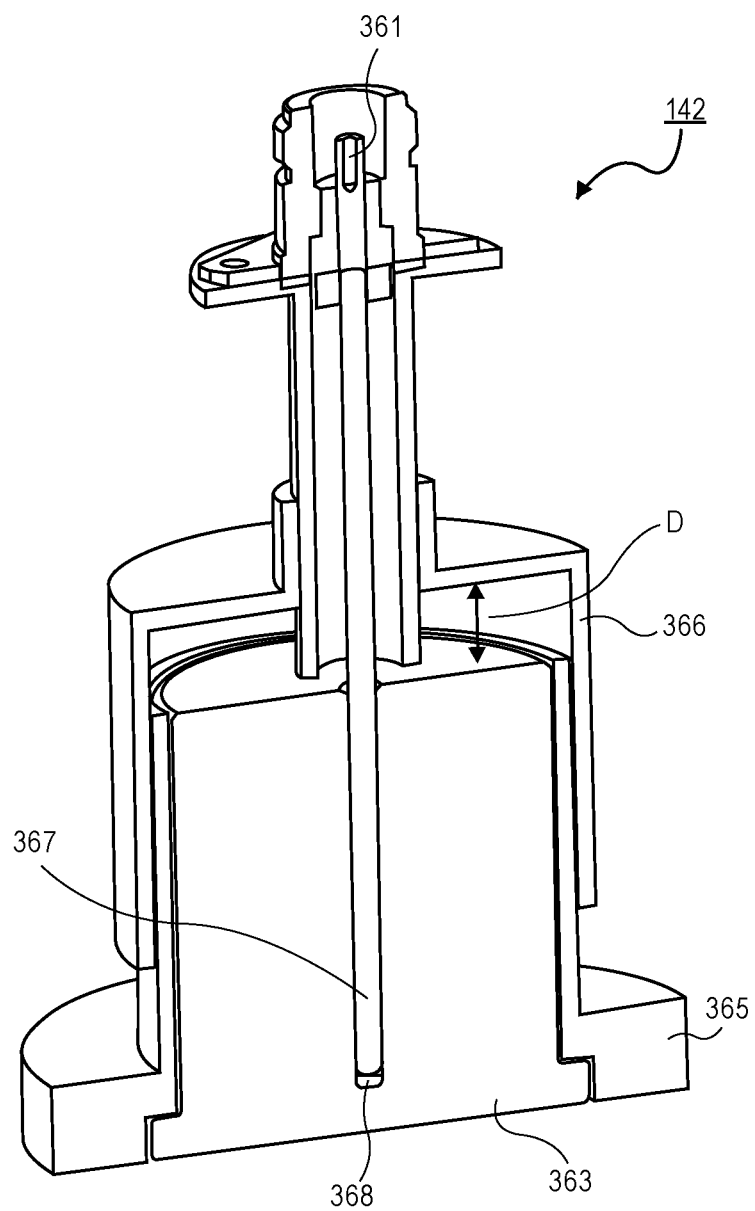
FIG. 3 is cross-sectional illustration of an applicator that may be used to couple microwave radiation to a processing chamber, in accordance with an embodiment.

Referring now to FIG. 3, a cut-away illustration of an applicator 142 is shown, according to an embodiment. In an embodiment, the electromagnetic radiation is transmitted to an applicator 142 by a coaxial cable 361 that couples to a monopole 367 that extends axially through the applicator 142. In an embodiment where the electromagnetic radiation is microwave radiation, the monopole 367 may also extend into a channel 368 formed into a center of a dielectric resonant cavity 363. The dielectric resonant cavity 363 may be a dielectric material, such as quartz, aluminum oxide, titanium oxide, or the like. Additional embodiments may also include a resonant cavity 363 that does not include a material (i.e., the dielectric resonant cavity 363 may be air or a vacuum). According to an embodiment, the dielectric resonator is dimensioned so that the dielectric resonator supports resonance of the microwave radiation. Generally, the size of the dielectric resonant cavity 363 is dependent on the dielectric constant of the material used to form the dielectric resonant cavity 363 and the frequency of the microwave radiation. For example, materials with higher dielectric constants would allow for smaller resonant cavities 363 to be formed. In an embodiment where the dielectric resonant cavity 363 includes a circular cross-section, the diameter of the dielectric resonant cavity 363 may be between approximately 1 cm and 15 cm. In an embodiment, the cross-section of the dielectric resonant cavity 363 along a plane perpendicular to the monopole 367 may be any shape, so long as the dielectric resonant cavity 363 is dimensioned to support resonance. In the illustrated embodiment, the cross-section along a plane perpendicular to the monopole 367 is circular, though other shapes may also be used, such as polygons (e.g., triangles, rectangles, etc.), symmetrical polygons (e.g., squares, pentagons, hexagons, etc.), ellipses, or the like).

In an embodiment, the cross-section of the dielectric resonant cavity 363 may not be the same at all planes perpendicular to the monopole 367. For example, the cross-section of a bottom extension proximate to the open end of the applicator housing 365 is wider than the cross-section of the dielectric resonant cavity proximate to the channel 368. In addition to having cross-sections of different dimensions, the dielectric resonant cavity 363 may have cross-sections with different shapes. For example, the portion of the dielectric resonant cavity 363 proximate to the channel 368 may have a circular shaped cross-section, whereas the portion of the dielectric resonant cavity 363 proximate to the open end of the applicator housing 365 may be a symmetrical polygon shape (e.g., pentagon, hexagon, etc.). However, it is to be appreciated that embodiments may also include a dielectric resonant cavity 363 that has a uniform cross-section at all planes perpendicular to the monopole 367.

According to an embodiment, the applicator 363 may also include an impedance tuning backshort 366. The backshort 366 may be a displaceable enclosure that slides over an outer surface of the applicator housing 365. When adjustments to the impedance need to be made, an actuator (not shown) may slide the backshort 366 along the outer surface of the applicator housing 365 to change a distance D between a surface of the backshort 366 and a top surface of the dielectric resonant cavity 363. As such, embodiments provide more than one way to adjust the impedance in the system. According to an embodiment, an impedance tuning backshort 366 may be used in conjunction with the feedback process described above to account for impedance mismatches. Alternatively, the feedback process or an impedance tuning backshort 366 may be used by themselves to adjust for impedance mismatches.

According to an embodiment, the applicator 142 functions as a dielectric antenna that directly couples the microwave electromagnetic field into the processing chamber 178. The particular axial arrangement of the monopole 367 entering the dielectric resonant cavity 363 may produce an TM01δ mode excitation. However different modes of excitation may be possible with different applicator arrangements. For example, while an axial arrangement is illustrated in FIG. 3, it is to be appreciated that the monopole 367 may enter the dielectric resonant cavity 363 from other orientations. In one such embodiment, the monopole 367 may enter the dielectric resonant cavity 363 laterally, (i.e., through a sidewall of the dielectric resonant cavity 363).

It is to be appreciated that the applicator 142 illustrated in FIG. 3 is exemplary in nature, and embodiments are not limited to the design described. For example, the applicator 142 in FIG. 3 is particularly suitable for emitting microwave radiation. However, embodiments may include any applicator design that is configured to emit any high-frequency electromagnetic radiation.

Figure 4:
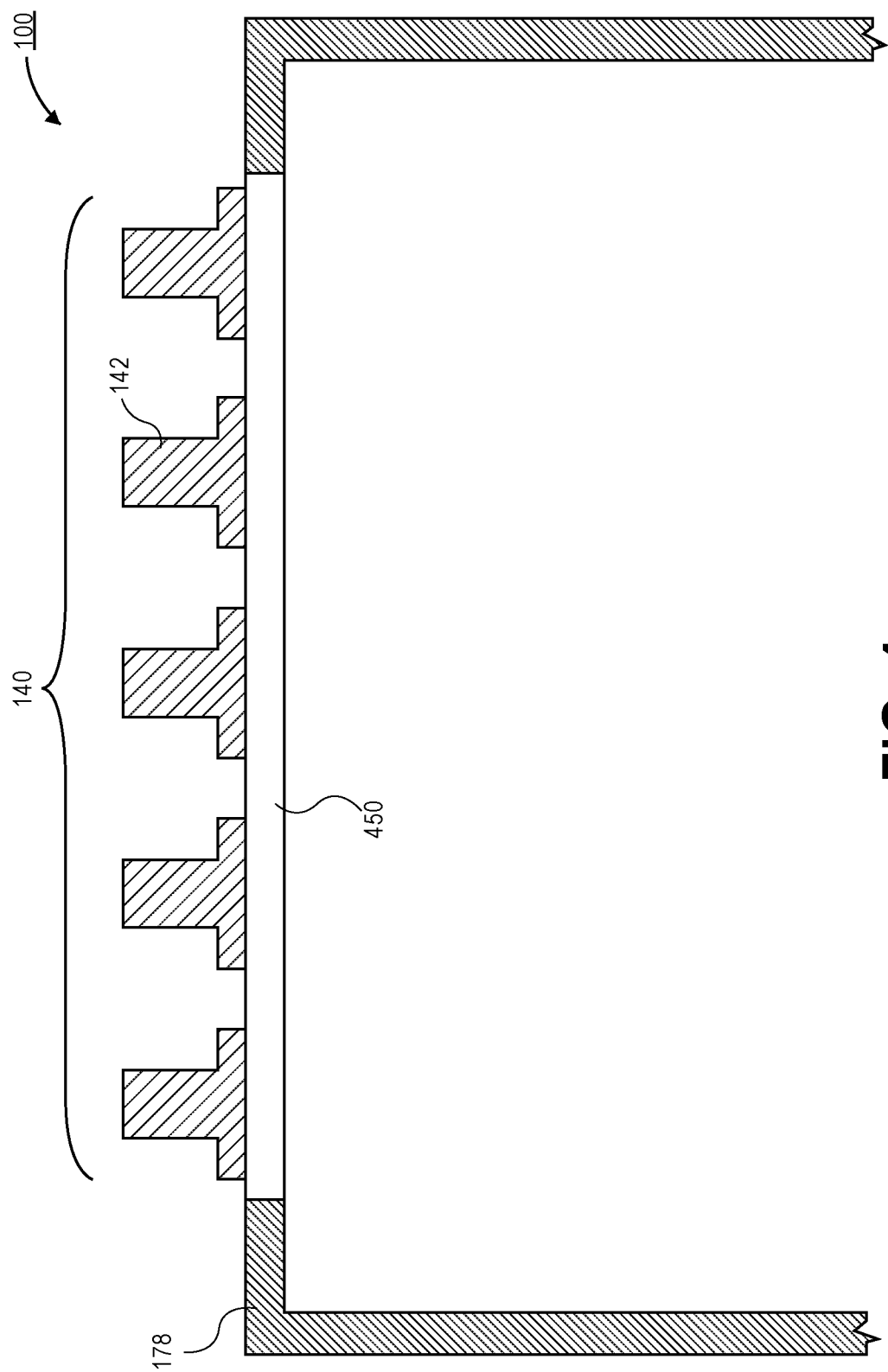
FIG. 4 is a cross-sectional illustration of an array of applicators positioned on a dielectric sheet that is part of the processing chamber, in accordance with an embodiment.

Referring now to FIG. 4, an illustration of a portion of a processing tool 100 with an array 140 of applicators 142 coupled to the chamber 178 is shown, according to an embodiment. In the illustrated embodiment, the high-frequency electromagnetic radiation from the applicators 142 is coupled into the chamber 178 by being positioned proximate to a dielectric plate 450. The proximity of the applicators 142 to the dielectric plate 450 allows for the high-frequency radiation resonating in the dielectric resonant cavity 363 (not shown in FIG. 4) to couple with the dielectric plate 450, which may then couple with processing gasses in the chamber to generate a plasma. In some embodiments where a plasma is not induced, the high-frequency radiation is coupled into the chamber volume to generate a radiation field. In one embodiment, the dielectric resonant cavity 363 may be in direct contact with the dielectric plate 450. In an additional embodiment, the dielectric resonant cavity 363 may be spaced away from a surface of the dielectric plate 450, so long as the microwave radiation can still be transferred to the dielectric plate 450. In additional embodiments, the applicators 142 may be set into cavities in the dielectric plate 450. In yet another embodiment, the applicators 142 may pass through the dielectric plate 450, so that the dielectric resonant cavities 363 are exposed to the interior of the chamber 178.

In an embodiment, the applicators 142 may include any antenna design that is configured to emit any frequency of the high-frequency electromagnetic radiation. In an embodiment, the array 140 of applicators may include more than one applicator 142 design. For example, the array 140 of applicators 142 may include a first applicator for emitting a first high-frequency radiation and a second applicator for emitting a second high-frequency radiation that is different than the first high-frequency radiation.

According to an embodiment, the array 140 of applicators 142 may be removable from the dielectric plate 450 (e.g., for maintenance, to rearrange the array of applicators to accommodate a substrate with different dimensions, or for any other reason) without needing to remove the dielectric plate 450 from the chamber 178. Accordingly, the applicators 142 may be removed from the processing tool 100 without needing to release a vacuum in the chamber 178. According to an additional embodiment, the dielectric plate 450 may also function as a gas injection plate or a showerhead.

Figure 5A:
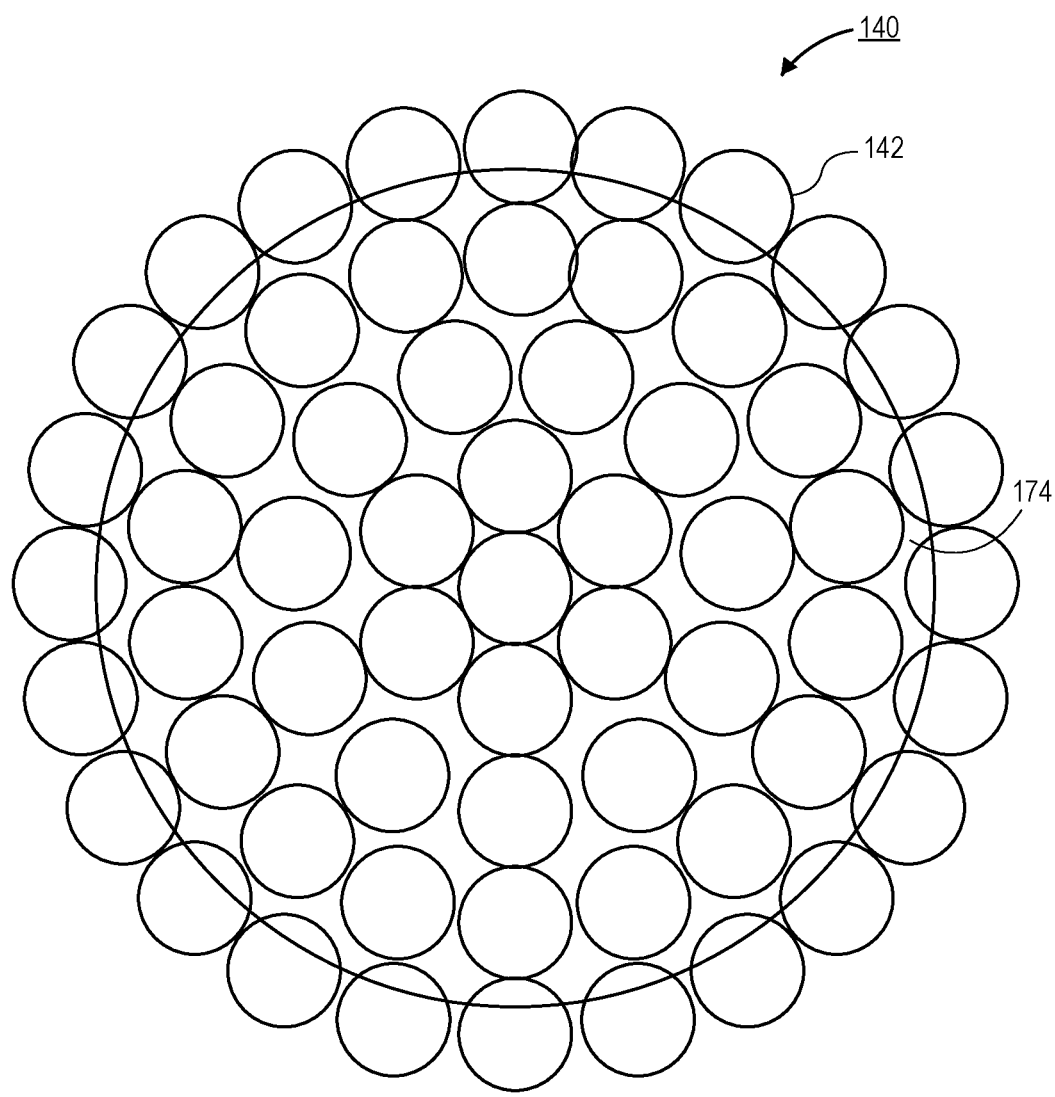
FIG. 5A is a plan view of an array of applicators that may be used to couple microwave radiation to a processing chamber, in accordance with an embodiment.

As noted above, an array of applicators 140 may be arranged so that they provide coverage of an arbitrarily shaped substrate 174. FIG. 5A is a plan view illustration of an array 140 of applicators 142 that are arranged in a pattern that matches a circular substrate 174. By forming a plurality of applicators 142 in a pattern that roughly matches the shape of the substrate 174, the radiation field and/or plasma becomes tunable over the entire surface of the substrate 174. For example, each of the applicators 142 may be controlled so that a plasma with a uniform plasma density across the entire surface of the substrate 174 is formed and/or a uniform radiation field across the entire surface of the substrate 174 is formed. Alternatively, one or more of the applicators 142 may be independently controlled to provide plasma densities that are variable across the surface of the substrate 174. As such, incoming nonuniformity present on the substrate may be corrected. For example, the applicators 142 proximate to an outer perimeter of the substrate 174 may be controlled to have a different power density than applicators proximate to the center of the substrate 174. Furthermore, it is to be appreciated that the use of high-frequency emission modules 105 that are communicatively coupled to a phase controller (as described above) may function as a phased array and allow for controlled interference to provide a radiation field and/or plasma with static maxima and minima at desired locations, a radiation field and/or plasma with dynamic maxima and minima, and/or a uniform radiation field and/or plasma.

In FIG. 5A, the applicators 142 in the array 140 are packed together in a series of concentric rings that extend out from the center of the substrate 174. However, embodiments are not limited to such configurations, and any suitable spacing and/or pattern may be used depending on the needs of the processing tool 100. Furthermore, embodiments allow for applicators 142 with any symmetrical cross-section, as described above. Accordingly, the cross-sectional shape chosen for the applicator may be chosen to provide enhanced packing efficiency.

Figure 5B:
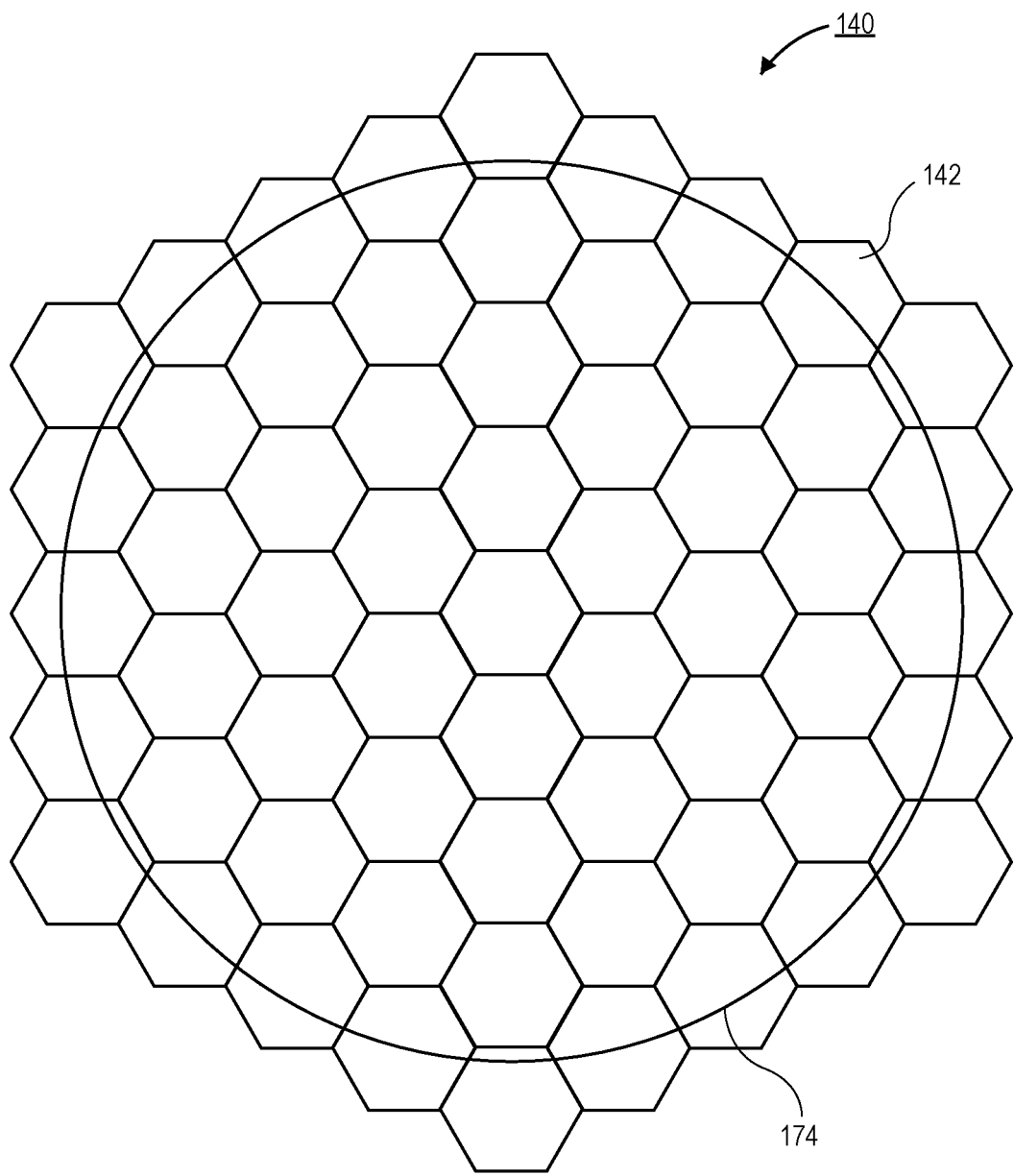
FIG. 5B is a plan view of an array of applicators that may be used to couple microwave radiation to a processing chamber, in accordance with an additional embodiment.

Referring now to FIG. 5B, a plan view of an array 140 of applicators 142 with a non-circular cross-section is shown, according to an embodiment. The illustrated embodiment includes applicators 142 that have hexagonal cross-sections. The use of such an applicator may allow for improved packing efficiency because the perimeter of each applicator 142 may mate nearly perfectly with neighboring applicators 142. Accordingly, the uniformity of the plasma may be enhanced even further since the spacing between each of the applicators 142 may be minimized. While FIG. 5B illustrates neighboring applicators 142 sharing sidewall surfaces, it is to be appreciated that embodiments may also include non-circular symmetrically shaped applicators that include spacing between neighboring applicators 142.

Figure 5C:
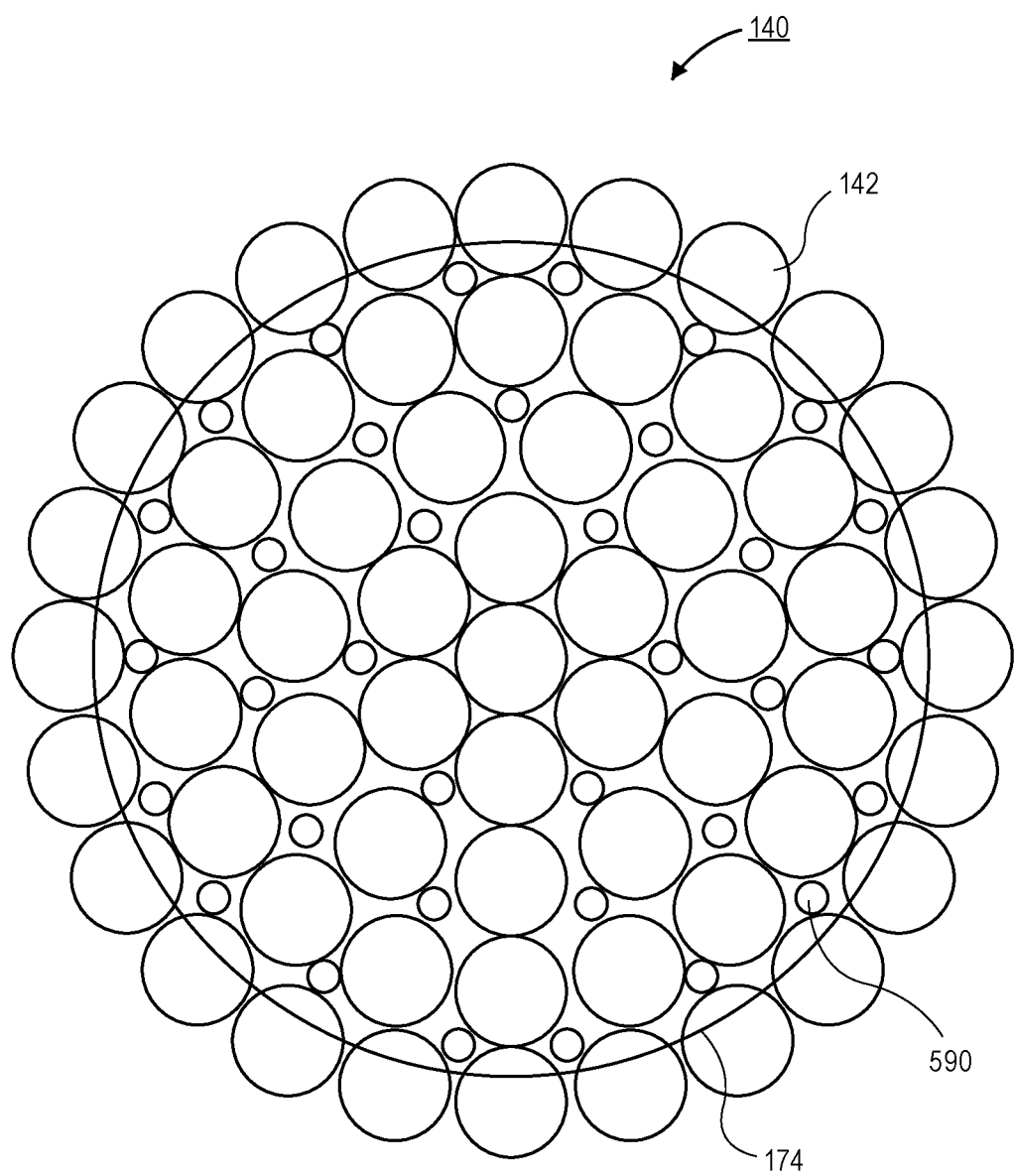
FIG. 5C is a plan view of an array of applicators and a plurality of sensors for detecting conditions of a plasma, in accordance with an embodiment.

Referring now to FIG. 5C, an additional plan-view illustration of an array 140 of applicators 142 is shown according to an embodiment. The array 140 in FIG. 5C is substantially similar to the array 140 described above with respect to FIG. 5A, except that a plurality of sensors 590 are also included. The plurality of sensors provides improved process monitoring capabilities that may be used to provide additional feedback control of each of the modular microwave sources 105. In an embodiment, the sensors 590 may include one or more different sensor types 590, such as plasma density sensors, plasma emission sensors, radiation field density sensors, radiation emission sensors, or the like. Positioning the sensors across the surface of the substrate 174 allows for the radiation field and/or plasma properties at given locations of the processing chamber 100 to be monitored.

According to an embodiment, every applicator 142 may be paired with a different sensor 590. In such embodiments, the output from each sensor 590 may be used to provide feedback control for the respective applicator 142 to which the sensor 590 has been paired. Additional embodiments may include pairing each sensor 590 with a plurality of applicators 142. For example, each sensor 590 may provide feedback control for multiple applicators 142 to which the sensor 590 is proximately located. In yet another embodiment, feedback from the plurality of sensors 590 may be used as a part of a multi-input multi-output (MIMO) control system. In such an embodiment, each applicator 142 may be adjusted based on feedback from multiple sensors 590. For example, a first sensor 590 that is a direct neighbor to a first applicator 142 may be weighted to provide a control effort to the first applicator 142 that is greater than the control effort exerted on the first applicator 142 by a second sensor 590 that is located further from the first applicator 142 than the first sensor 590.

Figure 5D:
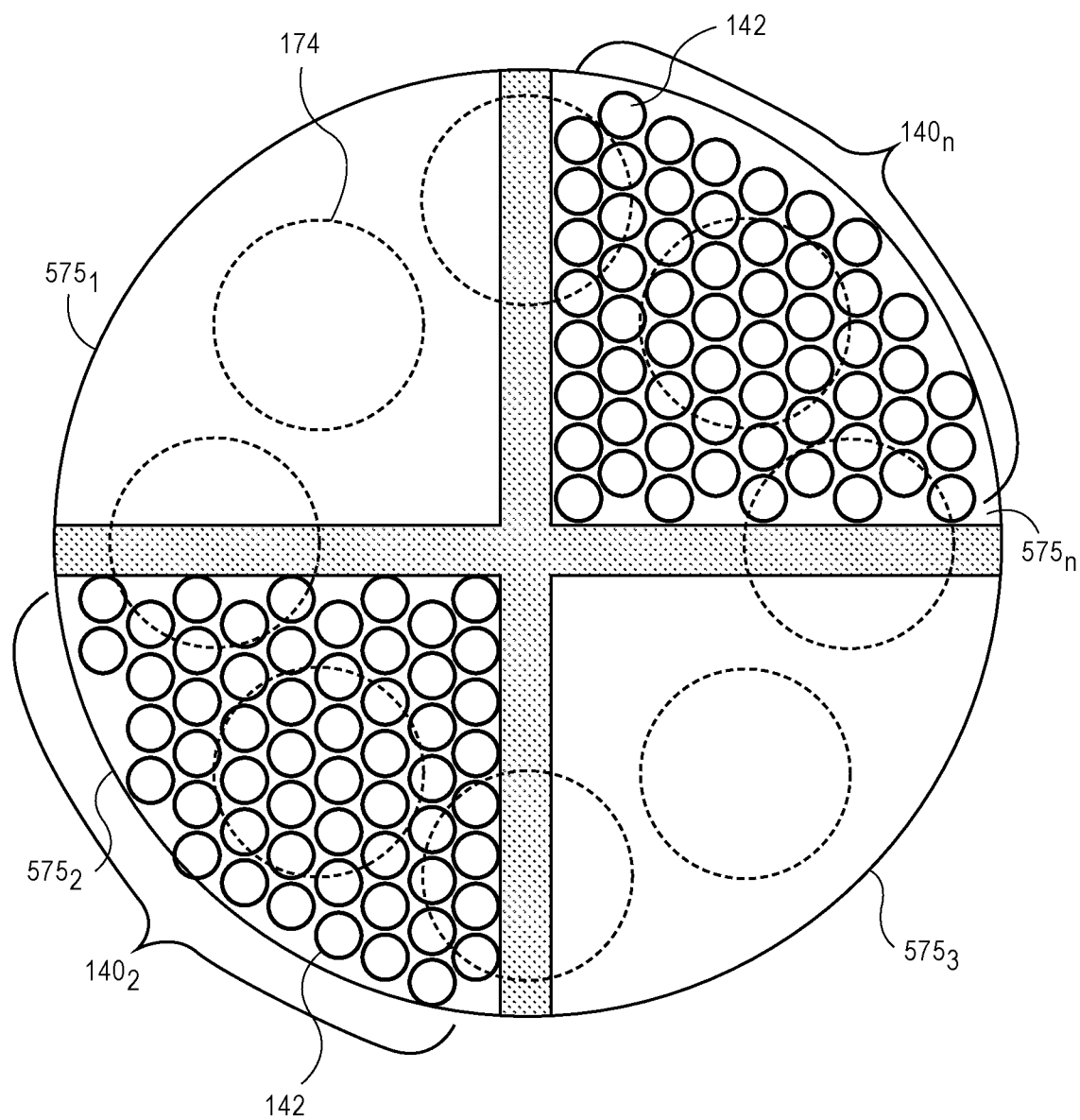
FIG. 5D is a plan view of an array of applicators that are formed in two zones of a multi-zone processing tool, in accordance with an embodiment.

Referring now to FIG. 5D, an additional plan-view illustration of an array 140 of applicators 142 positioned in a multi-zone processing tool 100 is shown, according to an embodiment. In an embodiment, the multi-zone processing tool 100 may include any number of zones. For example, the illustrated embodiment includes zones $575_1$-$575_n$. Each zone 575 may be configured to perform different processing operations on substrates 174 that are rotated through the different zones 575. As illustrated, a first array $140_2$ is positioned in zone 575₂ and a second array 140ₙ is positioned in zone 575ₙ. However, embodiments may include multi-zone processing tools 100 with an array 140 of applicators 142 in one or more of the different zones 575, depending on the needs of the device. The spatially tunable density of the plasma and/or radiation field provided by embodiments allows for the accommodation of nonuniform radial velocity of the rotating substrates 174 as they pass through the different zones 475.

Figure 6:
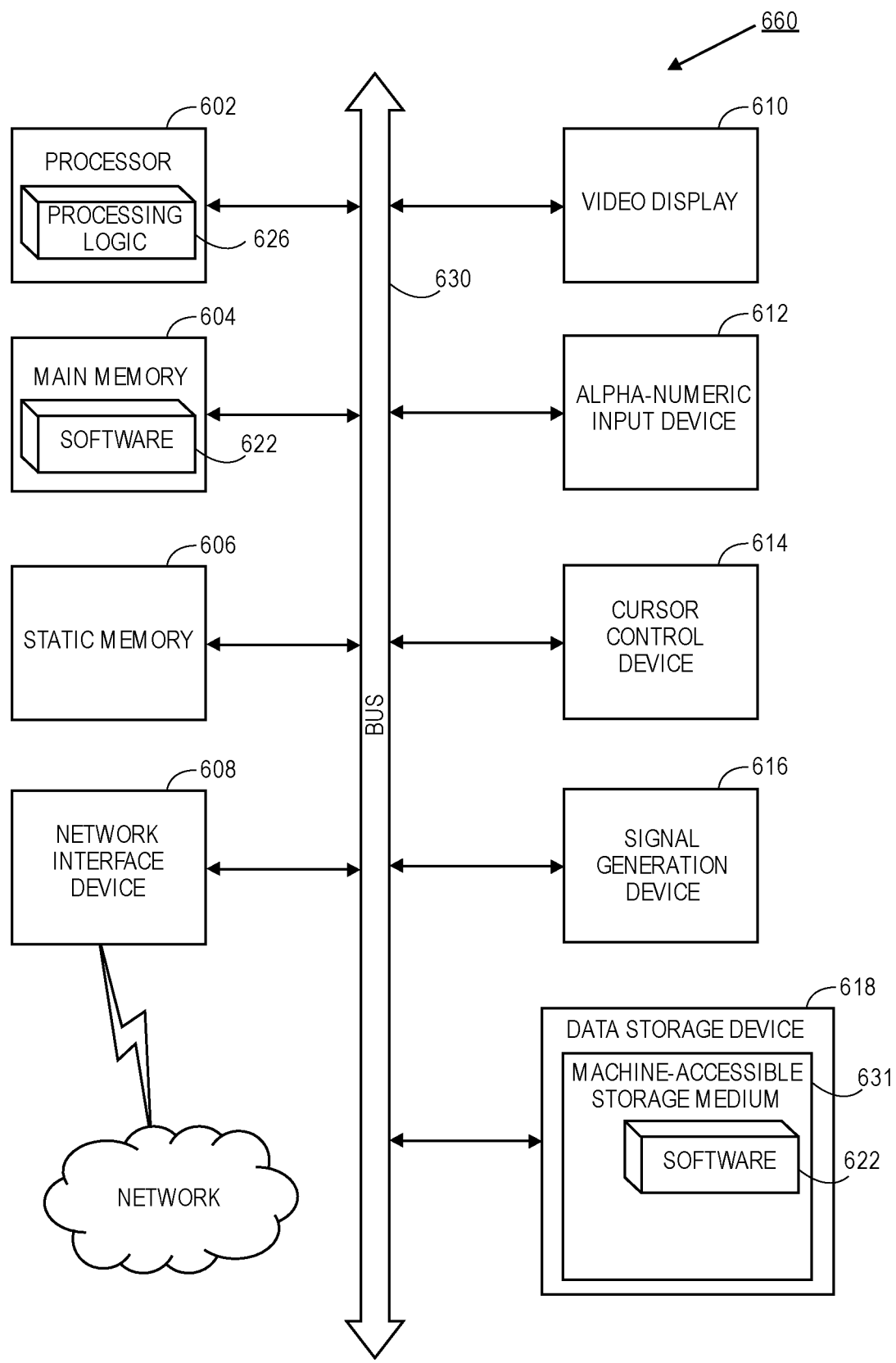
FIG. 6 illustrates a block diagram of an exemplary computer system that may be used in conjunction with a modular microwave radiation source, in accordance with an embodiment.

Referring now to FIG. 6, a block diagram of an exemplary computer system 660 of a processing tool 100 is illustrated in accordance with an embodiment. In an embodiment, computer system 660 is coupled to and controls processing in the processing tool 100. Computer system 660 may be connected (e.g., networked) to other machines in a Local Area Network (LAN), an intranet, an extranet, or the Internet. Computer system 660 may operate in the capacity of a server or a client machine in a client-server network environment, or as a peer machine in a peer-to-peer (or distributed) network environment. Computer system 660 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 660, the term "machine" shall also be taken to include any collection of machines (e.g., computers) that individually or jointly execute a set (or multiple sets) of instructions to perform any one or more of the methodologies described herein.

Computer system 660 may include a computer program product, or software 622, having a non-transitory machine-readable medium having stored thereon instructions, which may be used to program computer system 660 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 660 includes a system processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

System processor 602 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 602 may also be one or more special-purpose processing devices such as an application specific integrated circuit (ASIC), a field programmable gate array (FPGA), a digital signal system processor (DSP), network system processor, or the like. System processor 602 is configured to execute the processing logic 626 for performing the operations described herein.

The computer system 660 may further include a system network interface device 608 for communicating with other devices or machines. The computer system 660 may also include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium 631 (or more specifically a computer-readable storage medium) on which is stored one or more sets of instructions (e.g., software 622) embodying any one or more of the methodologies or functions described herein. The software 622 may also reside, completely or at least partially, within the main memory 604 and/or within the system processor 602 during execution thereof by the computer system 660, the main memory 604 and the system processor 602 also constituting machine-readable storage media. The software 622 may further be transmitted or received over a network 620 via the system network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A modular high-frequency emission source, comprising:
   a plurality of high-frequency emission modules, wherein each high-frequency emission module comprises:
   an oscillator module;
   an amplification module; and
   an applicator, wherein the applicator comprises a dielectric body with a monopole antenna extending into an axial center of the dielectric body.

2. The modular high-frequency emission source of claim 1, wherein the applicator of each high-frequency emission module is part of a phased array.

3. The modular high-frequency emission source of claim 2, further comprising a phase controller, wherein the phase controller controls a phase relationship of electromagnetic radiation generated by the oscillator modules in order to form an electromagnetic radiation pattern emitted by the phased array.

4. The modular high-frequency emission source of claim 3, wherein the electromagnetic radiation pattern is a static pattern.

5. The modular high-frequency emission source of claim 3, wherein the electromagnetic radiation pattern is a dynamic pattern.

6. The modular high-frequency emission source of claim 1, wherein the high-frequency is a microwave frequency.

7. The modular high-frequency emission source of claim 1, wherein the high-frequency is 0.1 MHz to 300 GHz.

8. A modular high-frequency emission source, comprising:
- a plurality of high-frequency emission modules, wherein each high-frequency emission module comprises:
  - an oscillator module;
  - an amplification module;
  - an applicator, wherein the applicator comprises a dielectric body with a monopole antenna extending into the dielectric body; and
- a phase controller communicatively coupled to each of the oscillator modules, wherein the phase controller controls a phase relationship of the output high-frequency electromagnetic radiation generated by each of the oscillator modules.

9. The modular high-frequency emission source of claim 8, wherein the output high-frequency electromagnetic radiation excites a plasma.

10. The modular high-frequency emission source of claim 8, wherein the applicator of each high-frequency emission module is part of a phased array.

11. The modular high-frequency emission source of claim 10, wherein the phase controller generates an electromagnetic pattern emitted by the phased array.

12. The modular high-frequency emission source of claim 11, wherein the electromagnetic radiation pattern is a static pattern.

13. The modular high-frequency emission source of claim 11, wherein the electromagnetic radiation pattern is a dynamic pattern.

14. The modular high-frequency emission source of claim 8, wherein the high-frequency is a microwave frequency.

15. A processing tool, comprising:
- a processing chamber; and
- a modular high-frequency emission source, comprising:
  - a plurality of high-frequency emission modules, wherein each high-frequency emission module comprises:
    - an oscillator module;
    - an amplification module, wherein the amplification module is coupled to the oscillator module; and
    - an applicator positioned opposing a chuck that is in the processing chamber and on which one or more substrates are processed.

16. The processing tool of claim 15, wherein the applicator of each high-frequency emission module is part of a phased array.

17. The processing tool of claim 16, further comprising a phase controller, wherein the phase controller controls a phase relationship of electromagnetic radiation generated by the oscillator modules in order to form an electromagnetic radiation pattern emitted by the phased array.

18. The processing tool of claim 17, wherein the electromagnetic radiation excites a plasma.

19. The processing tool of claim 17, wherein the electromagnetic radiation pattern is a dynamic pattern.

20. The processing tool of claim 15, wherein the high-frequency is a microwave frequency.

* * * * *